United States Patent
Sano et al.

(10) Patent No.: US 8,038,431 B2
(45) Date of Patent: Oct. 18, 2011

(54) IMPRINT MOLD

(75) Inventors: Hisatake Sano, Saitama (JP); Yuki Aritsuka, Toshima-Ku (JP); Morihisa Hoga, Nishitokyo (JP); Hiroshi Fujita, Matsudo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 14 days.

(21) Appl. No.: 12/668,520

(22) PCT Filed: Jun. 30, 2008

(86) PCT No.: PCT/JP2008/061808
§ 371 (c)(1),
(2), (4) Date: Jan. 11, 2010

(87) PCT Pub. No.: WO2009/011215
PCT Pub. Date: Jan. 22, 2009

(65) Prior Publication Data
US 2010/0189839 A1    Jul. 29, 2010

(30) Foreign Application Priority Data

Jul. 17, 2007    (JP) .................................. 2007-185659

(51) Int. Cl.
*A01J 21/00*    (2006.01)
(52) U.S. Cl. ...................... 425/385; 425/174.4; 264/293

(58) Field of Classification Search ............... 425/174.4, 425/385; 264/293
See application file for complete search history.

(56) References Cited

U.S. PATENT DOCUMENTS

| | | | |
|---|---|---|---|
| 2006/0266916 A1* | 11/2006 | Miller et al. ................... | 249/134 |
| 2006/0272535 A1 | 12/2006 | Seki et al. | |
| 2007/0054097 A1 | 3/2007 | Suehira et al. | |

FOREIGN PATENT DOCUMENTS

| | | |
|---|---|---|
| JP | 2007-019466 A1 | 1/2007 |
| JP | 2007-103924 A1 | 4/2007 |
| JP | 2008-044289 A1 | 2/2008 |

* cited by examiner

*Primary Examiner* — Joseph Del Sole
*Assistant Examiner* — David N Brown, II
(74) *Attorney, Agent, or Firm* — Burr & Brown (57) ABSTRACT

An imprint mold including a substrate of transparent material having a first principal surface having a pattern region and a second principal surface; a first light shielding film provided on the first principal surface, along a periphery of the pattern region; and a second light shielding film provided on the second principal surface, having an opening including an opposite region to the pattern region, a part of the second light shielding film opposite to the first light shielding film. In a cross section perpendicular to the substrate, the maximum incident angle of the light for curing a transfer layer to the second principal surface is less than an angle between a perpendicular line of the second principal surface and a line connecting an end of the second light shielding film on a side of the opening and a farthest end of the first light shielding film from the pattern region.

5 Claims, 9 Drawing Sheets

IMPRINT MOLD

FIELD OF THE INVENTION

The present invention includes an imprint mold that transfers a pattern by curing the transfer layer with the irradiation of a light.

BACKGROUND OF THE INVENTION

In an optical imprint, an imprint mold is pressed into a transfer layer made of a light curing resin, and a pattern is transferred by separating the imprint mold from the transfer layer cured by irradiation of an ultraviolet (UV) light from a rear surface side of the imprint mold.

In manufacturing of a micro-electromechanical system (MEMS) device, a semiconductor device or the like, for example, patterns are formed on a plurality of transfer areas provided on a surface of a substrate, such as silicon (Si) and the like. In this case, the patterns are continuously transferred in a step-and-repeat manner by moving the imprint mold or the substrate in longitudinal and transverse (XY) directions.

Also, in manufacturing of an optical part, such as a micro lens, a diffraction grating and the like, for example, a pattern is formed on a surface of a windable substrate, such as a resin film and the like. In this case, the pattern is transferred while the substrate is sequentially rolled up onto a roll.

In the optical imprint, it is necessary to prevent leakage of the irradiation light through a unpatterned region of the imprint mold to the transfer layer. Moreover, since the pattern transferred from the imprint mold is composed of minute concaves and convexes on the surface, it is necessary to prevent adhesion of foreign particles on a surface of the transfer layer.

The imprint mold may be mechanically held with a peripheral area or side surfaces of the imprint mold, or with fixing of a rear surface of the imprint mold, in a mold holder of an imprint tool. When the transfer layer is cured, a portion of the transfer layer, which is located in the vicinity of a target transfer area, may be also cured by the light transmitted through the unpatterned region around the pattern region of the imprint mold. It is impossible to transfer a pattern to the cured portion of the transfer layer. For this reason, a width of boundary area between the transfer areas adjacent to each other may become larger than necessary.

For example, there is a technique for forming an light shielding film in a region other than the pattern region of the imprint mold and preventing curing of the transfer layer other than the target transfer area (refer to JP-A 2007-19466 (KOKAI)). However, when a part of the light shielding film is held so as to be in contact with the mold holder of the imprint tool, there is a fear in that the foreign particles, generated from the light shielding film due to a mechanical external force when transfer is repeated or when the imprint mold puts on to the imprint tool or takes off from the imprint tool, adhere on the transfer layer directly or through adhesion to the mold holder. When the light shielding film is not formed on a portion held by the mold holder in order to prevent generation of the foreign particles, the irradiation light may leak from a gap between the mold holder and the light shielding film.

SUMMARY OF INVENTION

It is an object of the present invention to provide an imprint mold capable of preventing light leakage from an unpatterned region, and suppressing adhesion of foreign particles on a surface of a transfer layer.

An aspect of the present invention inheres in an imprint mold for transferring a pattern by pressing a pattern region into a transfer layer and by curing the transfer layer with irradiation of a light, the imprint mold including a substrate of transparent material having a first principal surface having the pattern region and a second principal surface opposite to the first principal surface; a first light shielding film provided on the first principal surface, along a periphery of the pattern region; and a second light shielding film provided on the second principal surface, having an opening including an opposite region to the pattern region, a part of the second light shielding film opposite to the first light shielding film; wherein, in a cross section perpendicular to the substrate, the maximum incident angle of the light for curing the transfer layer to the second principal surface is less than an angle between a perpendicular line of the second principal surface and a line connecting an end of the second light shielding film on a side of the opening and a most far end of the first light shielding film 20 from the pattern region.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 1:
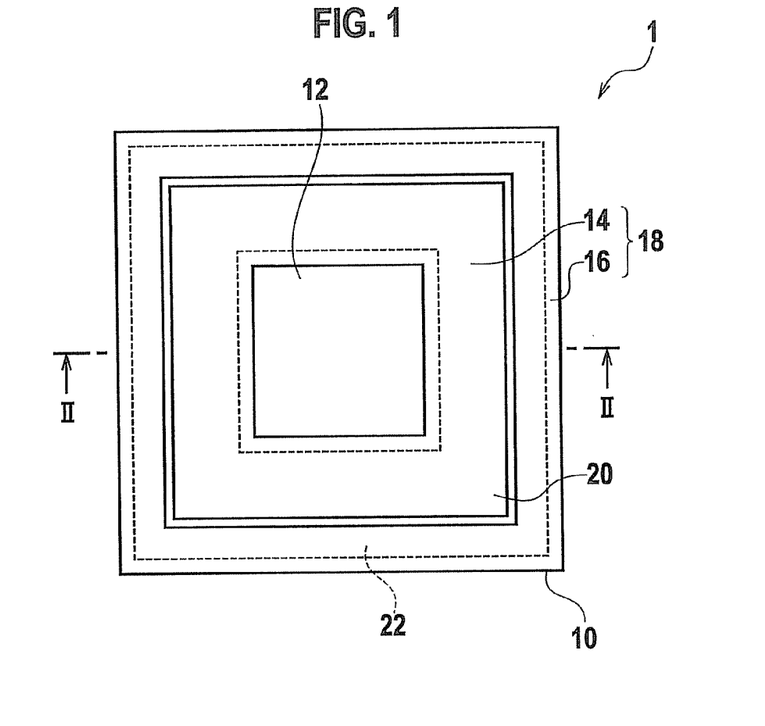
FIG. 1 is a plan view showing an example of an imprint mold according to an embodiment of the present invention.
Figure 2:
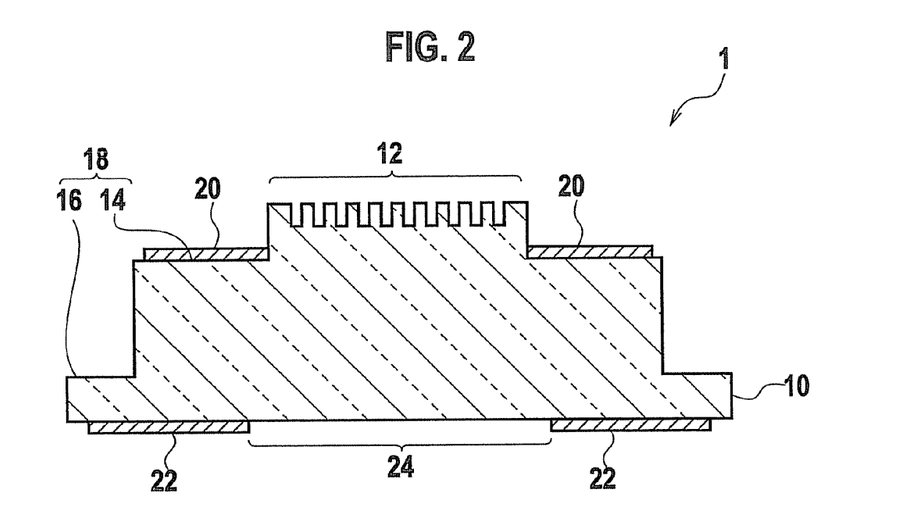
FIG. 2 is cross sectional view taken along line II-II of the imprint mold shown in FIG. 1.

An imprint mold 1 according to an embodiment of the present invention includes a substrate 10 having a first principal surface (front surface) and a second principal surface (rear surface) opposite to the front surface, a first light shielding film 20 provided on the front surface, and a second light shielding film 22 provided on the rear surface, as shown in FIGS. 1 and 2. A pattern region 12 and an unpatterned region 18 are provided on the front surface of the substrate 10. A first region 14 provided along a periphery of the pattern region 12 and a second region 16 extending from the first region 14 to an outer edge of the substrate 10 are provided in the unpatterned region 18.

The first light shielding film 20 is provided in the first region 14. The second light shielding film 22 has an opening 24 that includes a region opposite to the pattern region 12, and a part of the second light shielding film 22 is provided so as to be opposite to the first light shielding film 20. A pattern, such as a line and space (L/S) pattern, a dot pattern, a pillar pattern, a hole pattern and the like, is arranged in the pattern region 12. A shape of the pattern may be a concave type or a convex type to the front surface of the substrate 10. Also, a pitch and an aspect ratio (a value of a ratio of a groove depth to an opening width) of the pattern are not limited but may be arbitrary.

For the substrate 10 used for the optical imprint, a transparent material which transmits an UV light in a range of a wavelength between about 200 nm and about 400 nm may be used. For example, the transparent material, such as a quartz glass having a thickness of about 6 mm to about 7 mm, a heat resistance glass, calcium fluoride ($CaF_2$), magnesium fluoride ($MgF_2$), an acryl glass, and the like, and a laminated structure of those transparent materials may be used. In particular, a synthetic quartz has a high rigidity, a low thermal expansion coefficient and an high transmittance in a widely used wavelength of about 300 nm to about 380 nm, and thus the synthetic quartz is suitable as a material, used for the substrate 10.

For the first and second light shielding films 20, 22, the opaque material shielding the UV light may be used. For example, a metal, such as aluminum (Al), nickel (Ni), cobalt (Co), chrome (Cr), titanium (Ti), tantalum (Ta), tungsten (W), molybdenum (Mo), tin (Sn), zinc (Zn) and the like, a semimetal, such as silicon (Si) and the like, and an oxide, a nitride or an alloy of the metal or the semimetal may be used.

Figure 3:
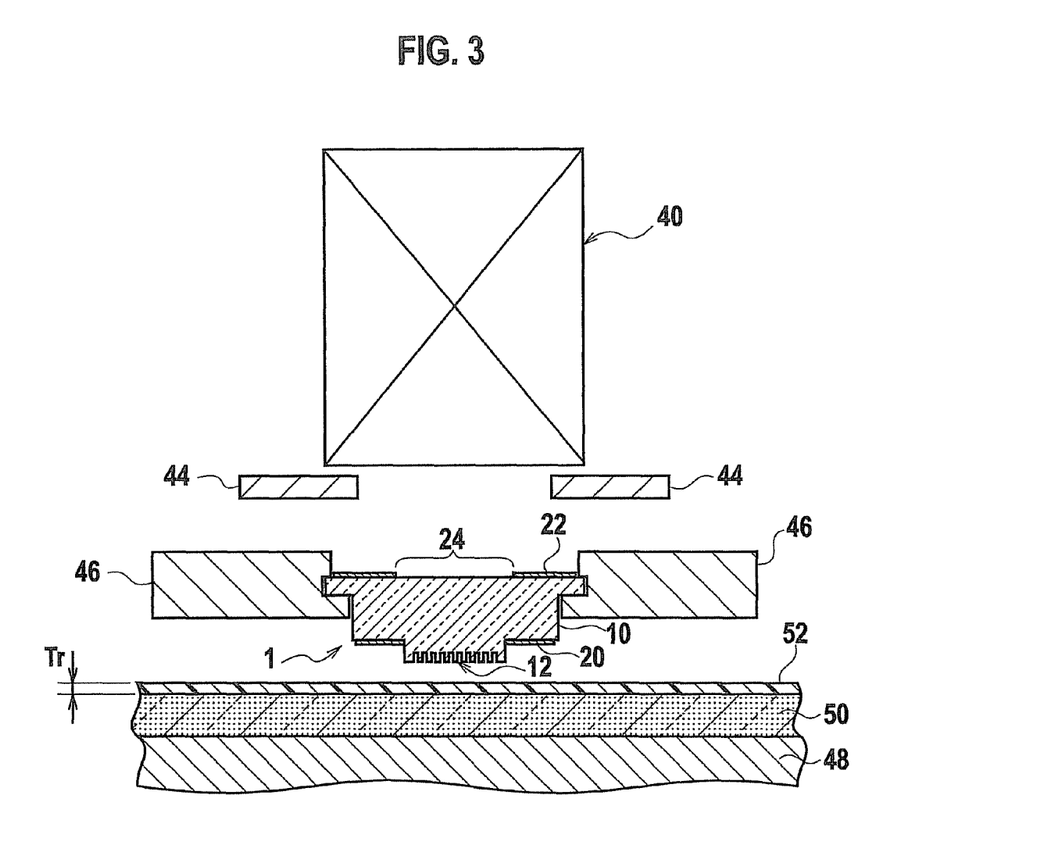
FIG. 3 is a block diagram showing an example of an imprint tool used for description of the embodiment of the present invention.

An imprint tool for the optical imprint includes an illumination optical system 40, a blind 44, a mold holder 46 and a substrate stage 48, as shown in FIG. 3. The mold holder 46 grasps the second region 16 shown in FIG. 2, and a portion of the substrate 10 exposed in the end of the rear surface. A transfer substrate 50 coated with a light curing transfer layer 52 of a thickness Tr on the front surface is placed on the substrate stage 48. The illumination optical system 40 includes a light source, a shutter, an integrator lens, a miller, a collimator lens and the like, which are not shown in the figure. In an UV light emitted from the illumination optical system 40, the unnecessary light is removed by the blind 44 and the mold holder 46 so as to illuminate only the opening 24 of the imprint mold 1 and a part of the second light shielding film 22.

Figure 4:
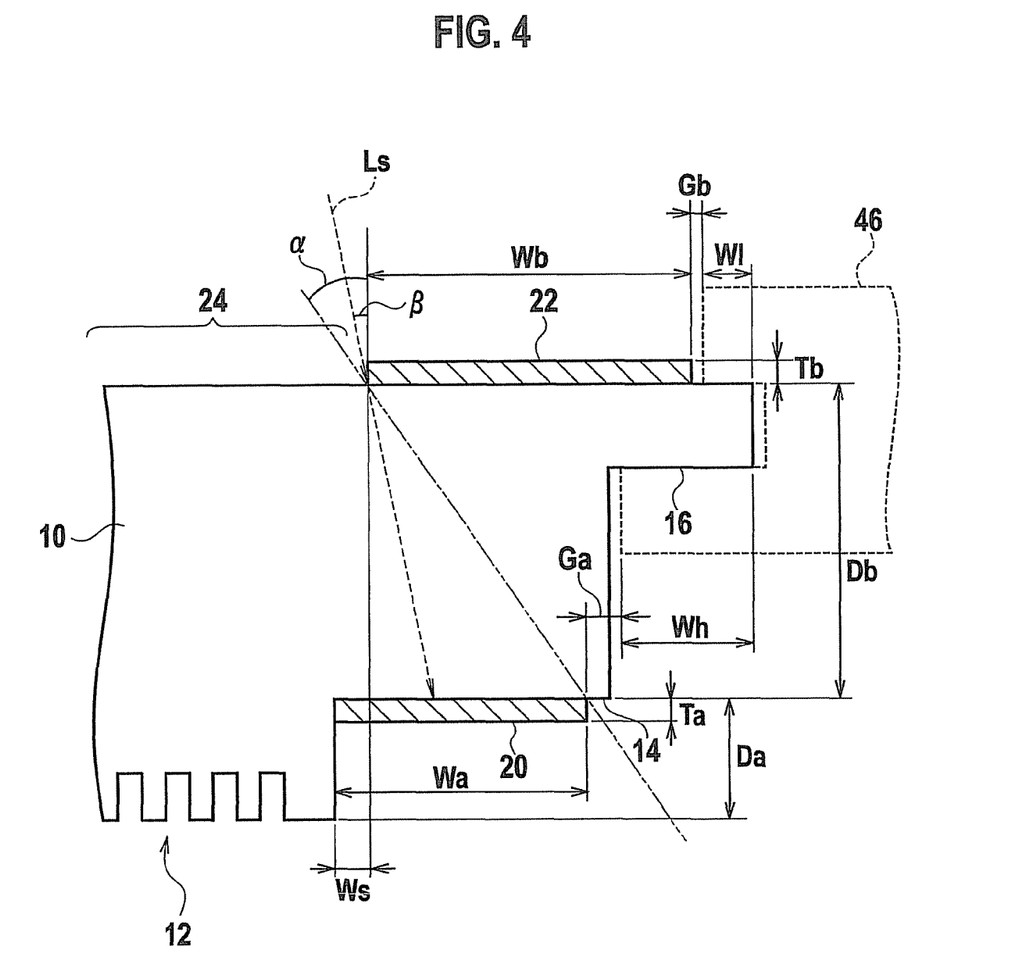
FIG. 4 is a cross-sectional view showing an example of a layout of the first and second light shielding films according to the embodiment of the present invention.

Moreover, as shown in FIG. 4, in the cross section perpendicular to the substrate 10, the maximum incident angle of an UV light Ls that is obliquely incident to the rear surface of the imprint mold 1 is denoted by $\beta$. Here, the first and second light shielding films 20, 22 are arranged such that the maximum incident angle $\beta$ is less than an angle $\alpha$ between a perpendicular line of the rear surface and a line connecting an end of the second light shielding film 22 on a side in contact with the opening 24 and the most far end of the first light shielding film 20 from the pattern region 12. In this way, it is possible to remove the UV light incident to the transfer layer 52 from the region except the pattern region 12.

Specifically, a width of the first light shielding film 20 extending from the end of the pattern region 12 is denoted by Wa, a displacement width of the second light shielding film 22 apart from a position corresponding to the end of the pattern region 12 in the rear surface of the substrate 10 is denoted by Ws, and a distance between the first and second light shielding films 20, 22 is denoted by Db. For the angle $\alpha$, the width Wa of the first light shielding film 20 is determined so as to satisfy the following equation (1)

$$\tan \alpha = (Wa - Ws)/Db > \tan \beta \quad (1)$$

It is noted that the displacement width Ws is intended to keep uniformity of an illumination intensity of the UV light illuminating the pattern region 12, by making the opening 24 wider than a region in the rear surface of the substrate 10 opposite to the pattern region 12.

For example, the distance Db is set to about 6 mm, and the displacement width Ws is set to about 1 mm. The maximum incident angle $\beta$ is different depending on the configuration of the illumination optical system 40, and for example, in the illumination optical system including a collimator lens for collimating a light emitted from a light source, broadening of an illumination light may be decreased to about 10° or less. In this case, from the equation (1), the width Wa of the first light shielding film 20 may be set to about 2 mm or more. Also, in the illumination optical system that does not use a collimator lens, broadening of an illumination light is between about 10° and 30°. In this case, the width Wa of the first light shielding film 20 may be set to about 4 mm or more.

The other end of the second light shielding film 22 on the most far side from the opening 24 extends to a portion between the periphery of the substrate 10 and a projected position of the most far end of the first light shielding film 20 from the pattern region 12 to the second principal surface. Specifically, the width Wb of the second light shielding film 22 is determined so that the second light shielding film 22 is located over a gap Gp provided between the first light shielding film 20 and the mold holder 46 grasping the second region 16 with a width Wh. As a result, light leakage from the gap Gp may be prevented.

Also, a gap Gb is provided between the second light shielding film 22 and the mold holder 46 grasping the rear surface of the substrate 10 with a width W1. Since the mold holder 46 grasps the substrate 10 without any contact with the second light shielding film 22, generation of foreign particles may be suppressed.

For the transfer layer 52, a light curing resin having a low viscosity in general, for example, between about 3 cp and about 100 cp is used. Therefore, for pressing the imprint mold 1, a low pressure is allowable. On the other hand, when the imprint mold 1 is separated from the light-cured transfer layer 52, it is desirable that an unnecessary stress is not applied to the imprint mold 1. Thus, it is necessary that the width Wh of the grasping region by the mold holder 46 in the second region 16 is larger as compared with the width W1 of the grasping region by the mold holder 46 on the rear surface side of the substrate 10. The width Wh may be set to the entire width of the second region 16.

Thicknesses Ta, Tb of the first and second light shielding films 20, 22 are required to be able to cut off the UV light. In general, for the light curing resin used as the transfer layer 52, an exposure amount of the UV light necessary for starting curing is about 1 $mJ/cm^2$, and an exposure amount necessary for the perfect curing is about 100 $mJ/cm^2$. Therefore, an opaque material and a thickness thereof are selected such that an optical density becomes 2 or more for the light for curing the transfer layer. Here, the optical density is defined as a value of common logarithm of an attenuation amount when a light is transmitted through a substance.

Additionally, it is desirable to provide a step Da between the front surface of the pattern region 12 and a surface of the first region 14, so that a level of a surface of the first light shielding film 20 is lower than a surface of the pattern region 12. In particular, it is desirable for the step Da to satisfy the following equation (2), for the thickness Tr of the transfer layer 52 and the thickness Ta of the first light shielding film 20.

$$Da-(Tr+Ta)>0 \qquad (2)$$

When the pattern region 12 is pressed into the transfer layer 52, a pressed amount of resin of the transfer layer 52 flows out to the concave portion of the pattern region 12 and the outside of the pattern region 12. On this occasion, in order to prevent the transfer layer 52 from contacting the first light shielding film 20, it is necessary to satisfy the relation of the equation (2). For providing details, in order to prevent the resin flowing out to the outside of the pattern region 12 from contacting the first light shielding film 20, it is necessary for Da−(Tr+Ta) not only to satisfy the relation of the equation (2) but also to be equal to or greater than a certain positive value.

Next, a method for fabricating a pattern by optical imprint using the imprint tool shown in FIG. 3 will be described with reference to FIGS. 5 and 6.

Figure 5:
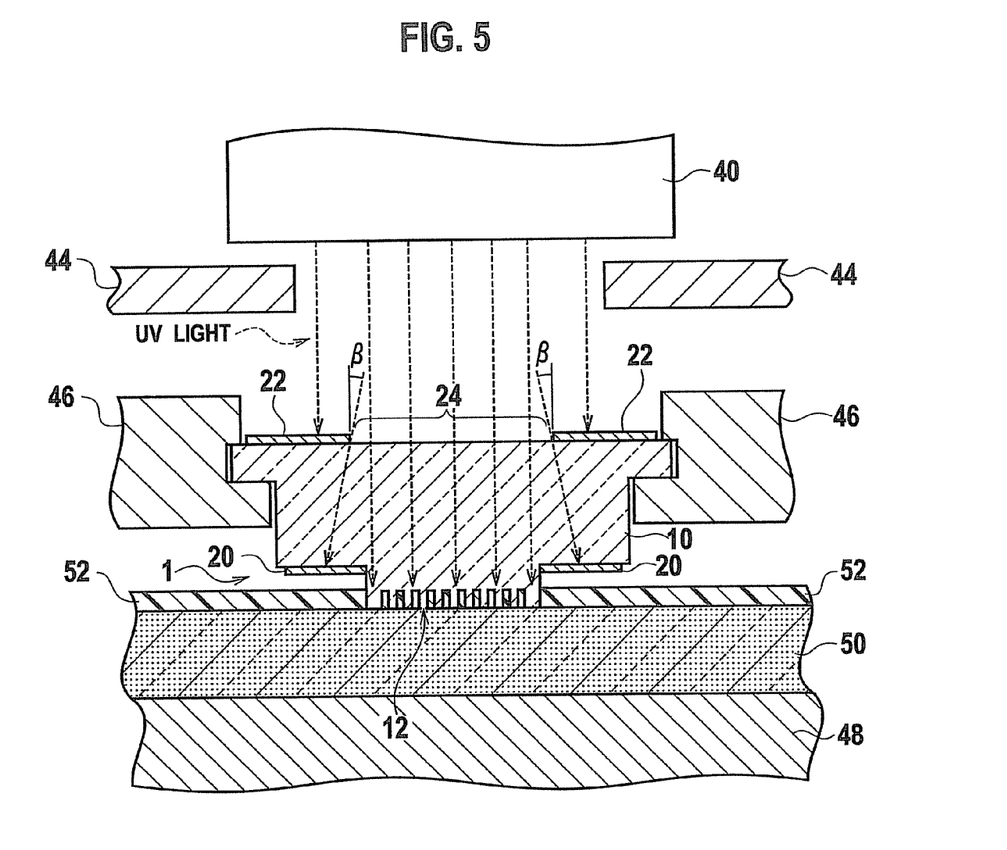
FIGS. 5 and 6 are cross-sectional views showing an example of transfer of a pattern using an imprint mold according to the embodiment of the present invention.

As shown in FIG. 5, the imprint mold 1 is pressed into the transfer layer 52 by driving the mold holder 46 or the substrate stage 48. While the imprint mold 1 is pressed into the transfer layer 52, the illumination optical system 40 irradiates the UV light from the rear surface side of the imprint mold 1.

Figure 6:
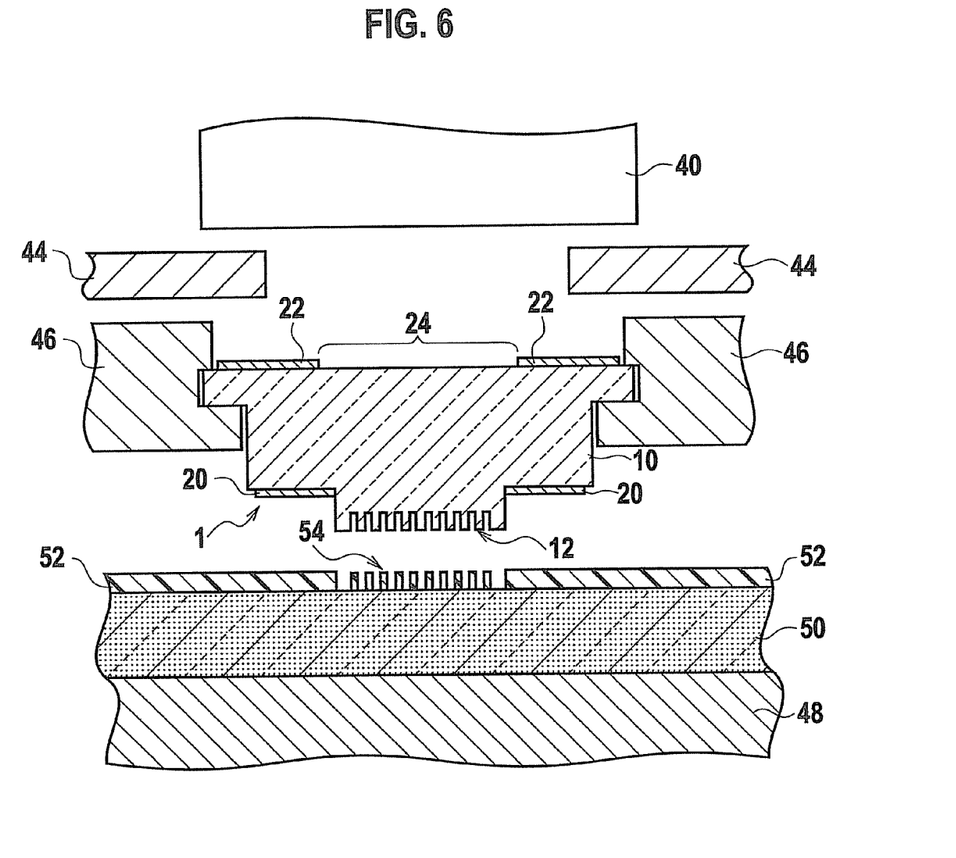

As shown in FIG. 6, the imprint mold 1 is separated from the transfer layer 52 cured by the light irradiation. In this way, the pattern of the pattern region 12 is transferred to the transfer layer 52, and a transfer layer pattern 54 is formed.

The UV light incident with the maximum incident angle β from the end of the opening 24 is shielded by the first light shielding film 20. Also, the UV light incident from above the second light shielding film 22 is shielded by the second light shielding film 22. Thus, the transfer layer 52 except the transfer layer pattern 54 is not cured by the light because the irradiation of the UV light is prevented.

Additionally, the mold holder 46 grasps the second region 16 of the substrate 10 and the rear surface in the imprint mold 1, and the mold holder 46 is not in contact with the first and second light shielding films 20, 22. Therefore, when the mold holder 46 grasps the imprint mold 1, it is possible to suppress generation of foreign particles from the first light shielding film 20 or the second light shielding film 22.

Thus, according to the imprint mold 1 according to the embodiment of the present invention, it is possible to prevent light leakage from the unpatterned region 18, and to suppress adhesion of foreign particles on the surface of the transfer layer 52.

(Modification)

Figure 7:
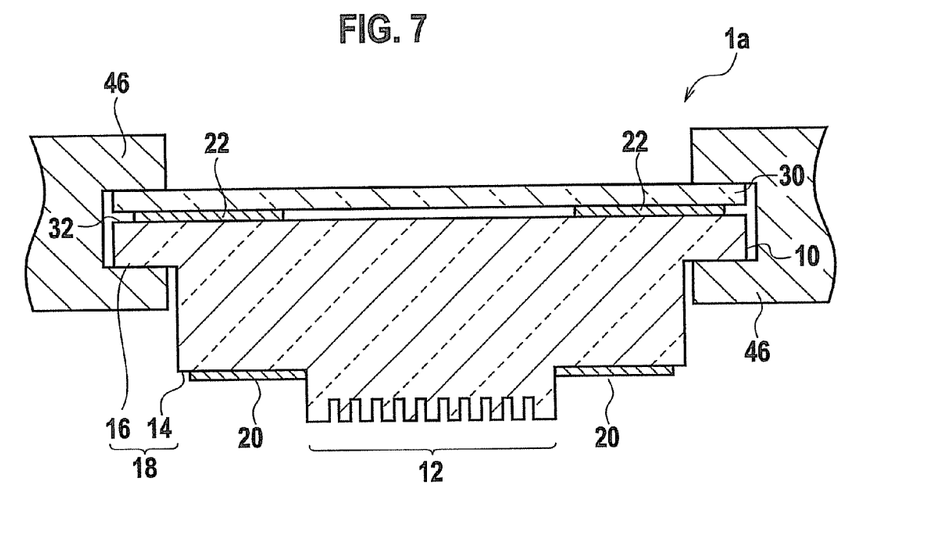
FIG. 7 is a cross-sectional view showing an example of an imprint mold according to a modification of the embodiment of the present invention.

An imprint mold 1a according to a modification of the embodiment of the present invention includes the substrate 10, the first light shielding film 20, the second light shielding film 22 and a transparent substrate 30, as shown in FIG. 7. The transparent substrate 30 is provided above the rear surface of the substrate 10 so as to cover the second light shielding film 22.

For the transparent substrate 30, a transparent material to transmit an UV light in a wavelength range between about 200 nm and about 400 nm may be used. For example, the transparent material, such as a quartz glass, a heat resistance glass, $CaF_2$, $MgF_2$, an acryl glass, and the like may be used.

The modification of the embodiment differs from the embodiment in that the transparent substrate 30 is placed on the rear surface of the substrate 10 so as to cover the second light shielding film 22. Other configurations are as in the embodiment, and thus duplicated descriptions are omitted.

In the modification of the embodiment, the second light shielding film 22 is covered with the transparent substrate 30. When the imprint mold 1a is held, the mold holder 46 grasps the second region 16 and the transparent substrate 30. On this occasion, the mold holder 46 can extend up to a portion corresponding to the upper portion of the second light shielding film 22 and can hold the imprint mold 1a with the wider region. Therefore, it is possible to suppress generation of foreign particles from the second light shielding film 22, and to increase a pushing pressure of the imprint mold 1a into the transfer layer.

Figure 8:
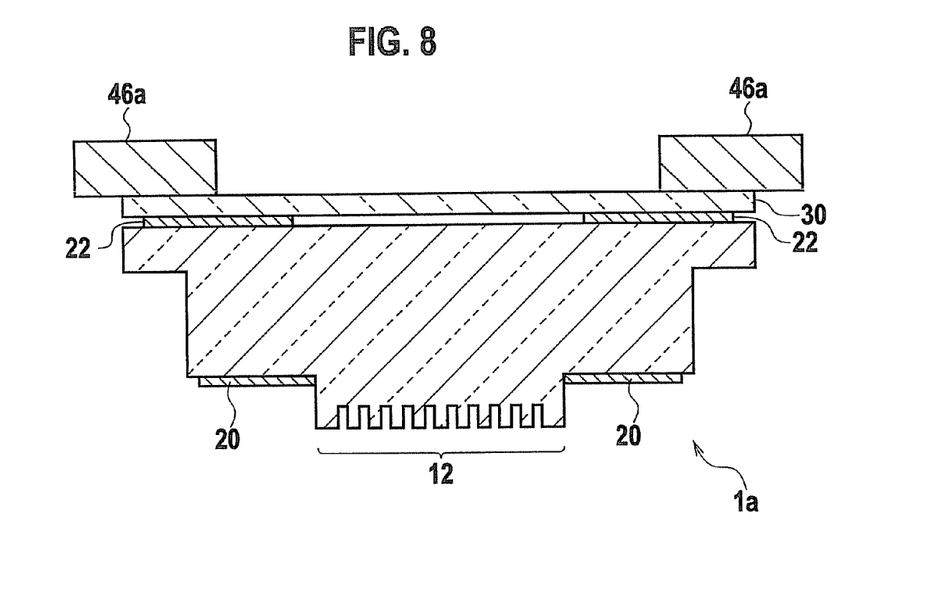
FIG. 8 is a cross-sectional view showing another example of supporting the imprint mold according to the modification of the embodiment of the present invention.

Also, as shown in FIG. 8, a mold holder 46a of a fixing type, such as an electrostatic chuck, a vacuum chuck or the like, may be used to hold the imprint mold 1a. On the rear surface side of the imprint mold 1a, the transparent substrate 30 is placed to cover the second light shielding film 22, thereby the generation of foreign particles caused by grasping the imprint mold 1a will not occur.

In this way, according to the imprint mold 1a according to the modification of the embodiment of the present invention, it is possible to prevent light leakage from the unpatterned region 18, and to suppress adhesion of foreign particles on the surface of the transfer layer 52.

Figure 9:
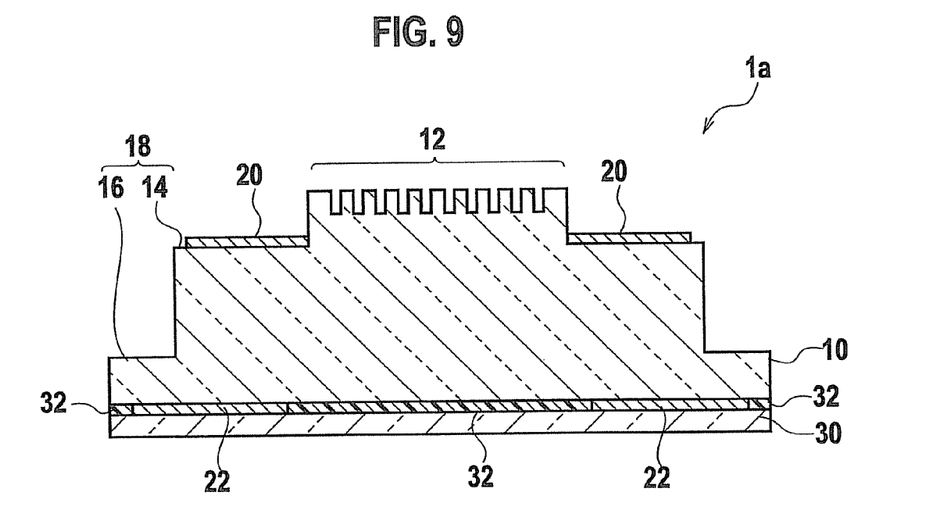
FIG. 9 is a cross-sectional view showing another example of an imprint mold according to a modification of the embodiment of the present invention.

In addition, the second light shielding film 22 is sandwiched between the substrate 10 and the transparent substrate 30. For this reason, there is a fear that the transparent substrate 30 will be deformed and damaged by the applied pressure for grasping or pushing the imprint mold 1a. In order to prevent the deformation of the transparent substrate 30, as shown in FIG. 9, an optical member 32 transparent for the UV light may be filled between the substrate 10 and the transparent substrate 30.

Figure 10:
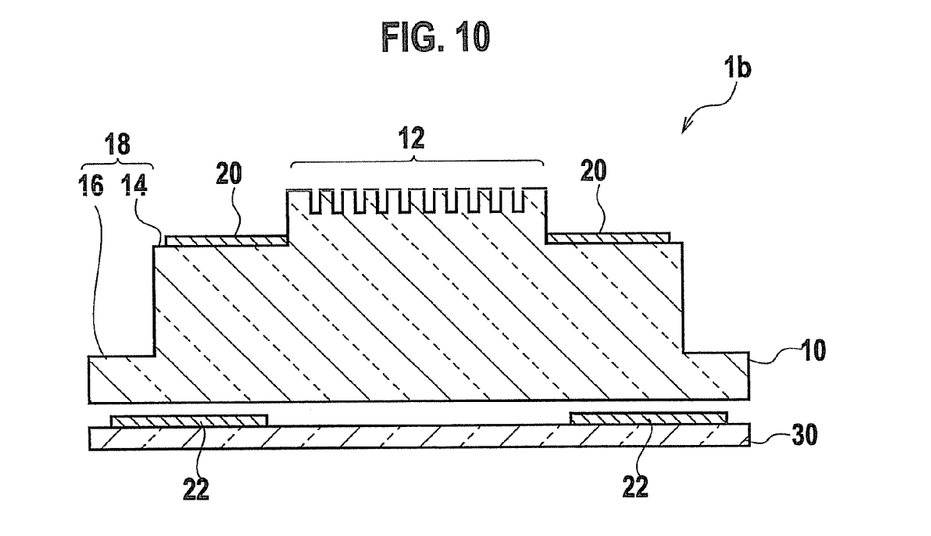
FIG. 10 is a cross-sectional view showing another example of an imprint mold according to the modification of the embodiment of the present invention.
Figure 11:
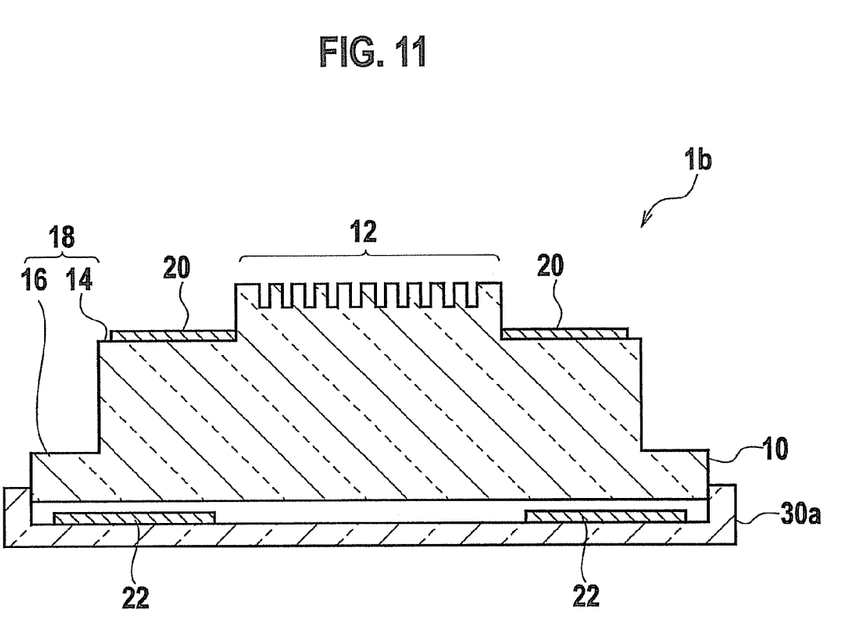
FIG. 11 is a cross-sectional view showing an example of an imprint mold according to the modification of the embodiment of the present invention.

Additionally, as shown in FIG. 10, an imprint mold 1b in which the second light shielding film 22 is provided on the transparent substrate 30 while separated from the substrate 10 may be used. The second light shielding film 22 may be formed on the transparent substrate 30. For alignment of the first light shielding film 20 provided on the substrate 10, and the second light shielding film 22 provided on the transparent substrate 30, alignment marks may be formed on the substrate 10 and the transparent substrate 30 in positions except for the pattern region 12 and the first and second light shielding films 20, 22. Alternatively, when alignment is possible with the outer shape as a reference, a structure to insert a transparent substrate 30a having the second light shielding film 22 to the substrate 10 may be used, as shown in FIG. 11.

Other Embodiments

The present invention has been described as mentioned above. However the descriptions and drawings that constitute a portion of this disclosure should not be perceived as limiting this invention. Various alternative embodiments and operational techniques will become clear to persons skilled in the art from this disclosure.

In the embodiment of the present invention, the first and second light shielding films 20, 22 are arranged so as to surround the pattern region 12 in order to prevent light leakage from the unpatterned region 18. For example, when a pattern is sequentially transferred in one direction while a transfer substrate, such as a resin film and the like, is rolled up onto a roll, light leakage to the rolled direction is not problematic. Therefore, each of the first and second light shielding films may be provided in a shape of letter "c" in a region except the rolled direction. Alternatively, each of the first and second light shielding films may be provided only in a region opposite to the rolled direction.

Figure 12:
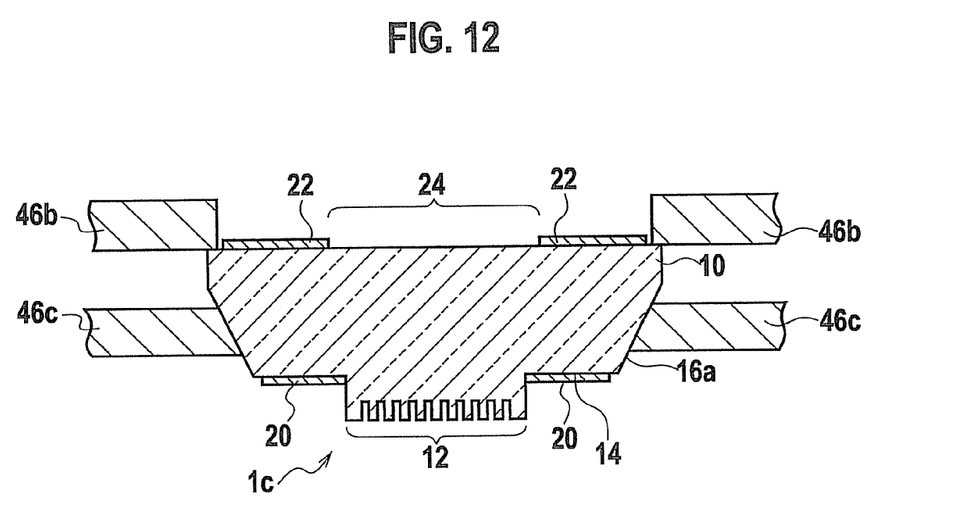
FIG. 12 is a cross-sectional view showing an example of an imprint mold according to other embodiments of the present invention.

Additionally, in the embodiment of the present invention, as shown in FIG. 2, the step is provided such that an approximately vertical side surface is exposed between the surfaces of the first and second regions 14, 16. However, a second region 16a may be a side surface that is inclined up to the periphery of the substrate 10 from the most far end of the first region 14 from the pattern region 12, as shown in FIG. 12. In this case, an imprint mold 1c is held in an imprint tool (not shown) by a first mold holder 46b in contact with the rear surface of the substrate 10 and a second mold holder 46c in contact with the second region 16a. For the second mold holder 46c, a pressure is applied so as to press the second region 16a in a direction parallel to the rear surface of the substrate 10, for example, by using a spring and the like. The imprint mold 1c is pressed to the first mold holder 46b in contact with the rear surface of the substrate 10, by the pressure applied to the second region 16a. As a result, the imprint mold 1c may be steadily held.

Various modifications will become possible for those skilled in the art after storing the teachings of the present disclosure without departing from the scope thereof.

The invention claimed is:

1. An imprint mold for transferring a pattern by pressing a pattern region into a transfer layer and by curing the transfer layer with irradiation of a light, the imprint mold comprising:
   a substrate of transparent material having a first principal surface having the pattern region and a second principal surface opposite to the first principal surface;
   a first light shielding film provided on the first principal surface, along a periphery of the pattern region; and
   a second light shielding film provided on the second principal surface, having an opening including an opposite region to the pattern region, a part of the second light shielding film opposite to the first light shielding film;
   wherein the opening has a wider area than the opposite region of the second principal surface to the pattern region, and
   wherein, in a cross section perpendicular to the substrate, the maximum incident angle of the light for curing the transfer layer to the second principal surface is less than an angle between a perpendicular line of the second principal surface and a line connecting an end of the second light shielding film on a side of the opening and a most far end of the first light shielding film from the pattern region.

2. The imprint mold according to claim 1, wherein a level of a surface of the first light shielding film is lower than a surface of the pattern region.

3. The imprint mold according to claim 1, wherein another end of the second light shielding film on a most far side from the opening extends between a projected position of the most far end of the first light shielding film from the pattern region to the second principal surface and a periphery of the substrate.

4. The imprint mold according to claim 1, further comprising:
   a transparent substrate provided above the second principal surface so as to cover the second light shielding film.

5. The imprint mold according to claim 1, wherein the substrate is a quartz glass.

* * * * *